United States Patent [19]

Lehmann et al.

[11] Patent Number: 5,705,235
[45] Date of Patent: Jan. 6, 1998

[54] PROCESS AND DEVICE FOR PRODUCTION OF THREE-DIMENSIONAL STRUCTURES THROUGH OPTICALLY STIMULATED PRECIPITATION OF A MATERIAL FROM A FLUIDIC COMPOUND

[75] Inventors: Olaf Lehmann, Wiesloch; Michael Stuke, Gottingen, both of Germany

[73] Assignee: Max-Planck-Gesellschaft zur Forderung der Wissenschaften e.V., Germany

[21] Appl. No.: 648,067

[22] PCT Filed: Nov. 18, 1994

[86] PCT No.: PCT/EP94/03821

§ 371 Date: Sep. 20, 1996

§ 102(e) Date: Sep. 20, 1996

[87] PCT Pub. No.: WO95/14115

PCT Pub. Date: May 26, 1995

[30] Foreign Application Priority Data

Nov. 19, 1993 [DE] Germany ............... 43 39 550.3

[51] Int. Cl.[6] ..................................... C23C 8/00
[52] U.S. Cl. ............... 427/586; 118/58; 118/722; 427/255.6; 427/255.7; 427/261; 427/265; 427/402; 427/407.1; 427/430.1; 427/596
[58] Field of Search ..................... 427/509, 510, 427/555, 586, 559, 596, 255.6, 255.7, 581, 261, 265, 402, 407.1, 430.1; 118/58, 722

[56] References Cited

PUBLICATIONS

Chemical Abstracts, vol. 122, Columbus, Ohio, US; Abstract No. 92666, Lehmann, O. et al., "Three–dimensional laser direct writing of electrically conducting and isolating microstructures." Materials Letters 21 (1994) 131–136 (No month avail.).

Journal of Applied Physics 72(1992) 15 Dec., No. 12, New York, US. "Microfabrication of three–dimensional boron structures by laser chemical processing." Johansson et al.

Patent Abstracts of Japan, vol. 8, No. 84 (E–239) (1521) 18 Apr. 1984 & JP,A,59 005 621 (Nippon Denki) 12 Jan. 1984.

*Primary Examiner*—Bernard Pianalto
*Attorney, Agent, or Firm*—William H. Murray; N. Stephan Kinsella

[57] ABSTRACT

For the manufacturing using an LCVD process of a rod-shaped, three-dimensional structure extending into three dimensions, two laser beams (12, 13) are focused on a common focal point (12a) in a gaseous or liquid medium containing a compound which produces the structure material when decompounded by the laser beams. In this way, structures which extend three-dimensionally may also be made from minimally absorbent materials which are essentially transparent. This additionally allows for good control of the direction of the growth of the structure.

8 Claims, 2 Drawing Sheets

PROCESS AND DEVICE FOR PRODUCTION OF THREE-DIMENSIONAL STRUCTURES THROUGH OPTICALLY STIMULATED PRECIPITATION OF A MATERIAL FROM A FLUIDIC COMPOUND

The present invention concerns a procedure and a device for the production of three-dimensional structures through optically stimulated precipitation of a structure material from a fluidic (gaseous or liquid) compound.

Using a process known as LCVD (Laser-Assisted Chemical Vapor Deposition) a laser beam focused on an even substrate surface serves to locally warm the substrate in the focus area. The substrate in this case is located in, for example, a reactive vapor atmosphere. In the warmed zone a chemical reaction is triggered in which the molecules of a gaseous compound on the substrate surface are thermally decompounded. In this way a certain portion of these molecules is deposited on the substrate surface (a metal, for example, when a metallo-organic gaseous compound is used) and only in the extremely limited area heated by the laser beam. If the substrate and the laser beam focal point in the substrate level are now moved in relation to each other, the warmed zone also moves on the substrate surface. In this way tracks/strips can be 'written' (deposited) with the precipitated material (the structure material).

It is also known that LCVD can be used to produce self-supporting, three-dimensional rod and spiral shaped structures from silicon, boron, or carbon, or to deposit a spiral of tungsten on a silicon rod. (Leyendecker et al., Appl. Phys. Lett. 39 (11), Dec. 1, 1981, 921–923; Bäuerle et al., Appl. Phys. A, 147–149 (1983); Boman et al., Micro Electro Mechanical Systems 92. Travemünde (Germany). Feb. 4–7, 1992, pg. 162–167. In these procedures a laser beam of sufficient lumination is focused on a substrate surface. After a certain amount of structure material has been precipitated onto the substrate surface, the focal point and the substrate surface are moved away from each other with a speed that maximally equals the rate of growth of the structure material in the direction of the relative movement. A thin rod of structure material then grows on the substrate.

The basis for the emergence of the rod (14) is as follows: In essentially opaque materials like carbon (graphite) for example, practically the entire optical beam is absorbed on the surface of the already precipitated material. The precipitated material is therefore particularly hot on the surface on which the laser beam is turned. The temperature of the interior of the precipitated materials drops exponentially in relation to the heat conducting characteristics of the material. The thermal decompounding of the compound which produces the structure material therefore takes place first on the upper surface of the precipitated structure material on which the laser beam has been focused and by which it is heated. Growth takes place from that point up to the laser beam. This effect is further strenghened by the fact that the newly precipitated material absorbs the laser light so that the hottest place shifts in the direction of the laser beam.

The task underlying the present invention is to specify an optical LCVD process and a device for the performance of such a process with which structures extending into three-dimensions can be generated particularly from materials which are minimally absorbent and essentially opaque, and, in addition, to allow better control of growth and direction of reproduction.

This task is accomplished through the process according to the invention and using the device according to the invention.

The process and device according to the invention are particularly suited for the manufacture of three-dimensional structures from minimally absorbent materials. The direction in which the material is precipitated and in which the structure grows can be easily controlled.

BRIEF DESCRIPTION OF THE DRAWINGS

In the following the invention is further clarified using the drawings as reference.

In the present process, use will be made of the known LCVD technique in which a substrate is arranged in a closed chamber with an atmosphere or medium containing a chemical compound that may be decompounded thermally or optically. The wall of the chamber will usually have a window through which the laser beam used to bring about the decompounding can be introduced.

Minimally absorbent, generally transparent structure materials with a greater absorption length exhibit a different behavior. Such materials are those in which the absorption length or the penetration depth (the distance until the intensity of the radiation sinks to 1/e times the initial intensity,) lies within the range of the structure diameter. When the rod diameter is, for example, 10 μm, as is typical for the procedure under discussion here, the absorption length is also in the range of 5–10 μm. Because the laser beam can here penetrate a considerable portion of the precipitated materials, the temperature profile along the axis of the laser beam is essentially less steep. The directional characteristic of the growth of the structure material is therefore basically less pronounced.

Figure 1:
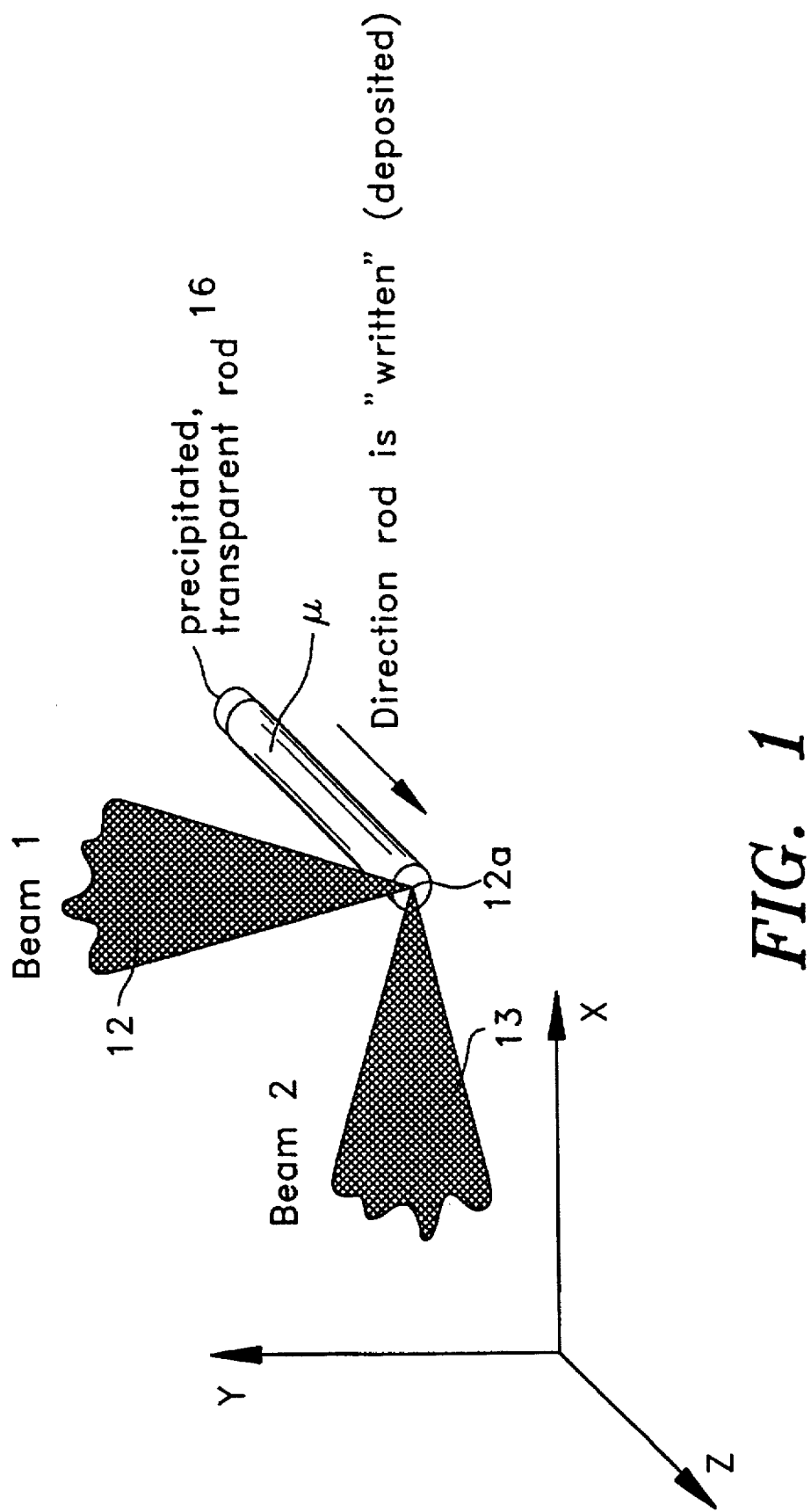
FIG. 1: A schematic representation for clarification of how the present invention may be executed.

The form of the process according to the invention represented in FIG. 1 is particularly, though not exclusively, suited for the production of any directed structure (especially rod-shaped) from minimally absorbent structural materials. Here, in addition to an initial laser beam 12, a second focused laser beam 13 is used whose focal point essentially coincides with focus 12a of the first laser beam. The output of each individual beam is designed to be so low that growth in the direction of one of the two beams is practically non-existent. In the intersecting point of both focused laser beams 12, 13, however, more light is absorbed per unit of volume of radiated material than in the surrounding material. Therefore the hottest area is located in this point of intersection of both beams or in the neighborhood of this intersection. The temperature profile is also approximately radially symmetrical. The growth of the structure material is therefore also essentially nondirectional. Through the movement of the intersection point of the laser beams, a desired direction of growth in three dimensions can be pre-set, particularly perpendicular to the axis of both beams, as indicated by an arrow in FIG. 1.

With the process shown in FIG. 1 it is possible to generate figures which consist of rods or of combinations of rods as well as other three dimensional figures of practically any imaginable form. The cross dimensions (diameter) are generally in the submillimeter range and below.

Figure 2:
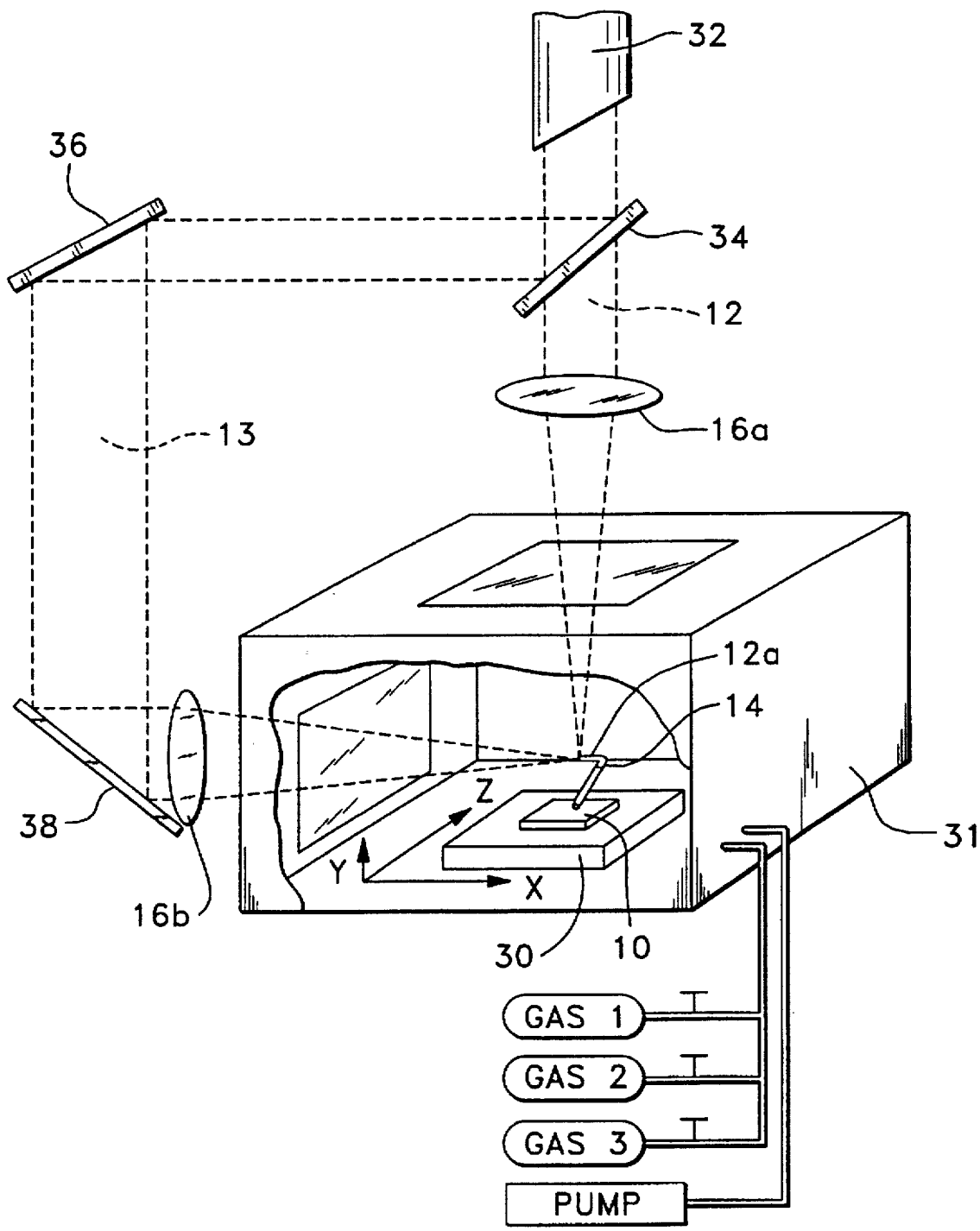
FIG. 2: A simplified representation of a device for performance of the process according to the invention.

The device represented by FIG. 2 contains a coordinate table 30 with which substrate 10 can be moved in three directions: x, y, and z. In special cases an additional degree of freedom of motion in the form of rotational axes may be useful. For example, up to six degrees of freedom of motion can be provided for—that is, 3 translation axes (x, y, and z)

and 3 rotation axes. The substrate is place by known means in an evacuated chamber 31 indicated only by schematic. A pumping system as well as a gas supply system are connected to this by known means.

Laser 32—for example $Ar^+$ Laser ($\lambda$=514 nm)—serves to produce two focused laser beams. The beam produced by the laser is divided into two partial beams of equal intensity through a beam splitter 34. One beam is focused through the first lens system 16a on to focal point 12a, whereas the other beam 13 is diverted using deviation mirrors 36, 38 and focused through a second lens system 16b to focal point 12a. The lens and mirror systems as well as the laser can be located outside of chamber 31. Two separate lasers or other optical radiation sources of sufficient intensity may be used to generate radiation bundles 12, 13.

The two laser beam bundles 12, 13 may also be produced by two separate lasers which emit light of different wave lengths. In connection with a chemical process that only occurs when both laser beams are present, the definition of the location can be further improved. For example, one laser could prepare a reaction which another would finish. The entire reaction then would take place only in the intersection point of both laser beams.

For the precipitation of material, compounds can be used as they are in known two-dimensional LCVD processes.

An example of a suitable material is aluminum oxide ($Al_2O_3$) which can be precipitated from the metallo-organic aluminum compound, trimethylamine (TMAA) and oxygen. Other possibilities include silicon oxide ($SiO_2$), precipitated from hydrosilicon or disilicane and laughing gas ($N_2O$), and other crystalline materials such as metallo-oxide compounds which sometimes have interesting characteristics such as piezoelectric properties. Nonconducting structures such as aluminum oxide structures can additionally be selectively plated with aluminum when a pure atmosphere of an aluminum-containing compound such as TMAA or triethylamine alanine (TEAA) is used. In this way conducting and nonconducting structures can be joined to electrode structures, for example, which can be used for optoelectronic or ion electronic components.

The primary use of the process discussed here may be the manufacture of micromechanical components. For the manufacture of microtechnical sensors and actuators, direct access to the third dimension makes this process interesting in comparison with conventional lithographic and etching techniques which result in essentially 2½ dimensional structures.

We claim:

1. A method for generating a structure on a surface of a substrate in which the structure material is precipitated through decompounding of a gaseous compound in the focus of a laser beam, the method comprising the steps of:

(a) focusing a first laser beam on a focus point on the substrate;

(b) focusing a second laser beam on the focus of the first laser beam so that the foci of the first and second laser beams substantially coincide; and (c) forming a structure extending from the substrate surface by moving the coinciding foci of the first and second laser beams and substrate surface away from each other at a speed maximally equal to the precipitated material growth rate in the direction of the movement of the coinciding foci in relation to the substrate.

2. The method of claim 1, wherein the gaseous compound produces the structure material through thermal decompounding which absorbs laser beam radiation relatively poorly.

3. An apparatus for generating a structure on a surface of a substrate in which the structure material is precipitated through decompounding of a gaseous compound in the focus of a laser beam, the apparatus comprising:

(a) first laser means for focusing a first laser beam on a focus point on the substrate;

(b) second laser means for focusing a second laser beam on the focus of the first laser beam so that the foci of the first and second laser beams substantially coincide; and (c) means for forming a structure extending from the substrate surface by moving the coinciding foci of the first and second laser beams and substrate surface away from each other at a speed maximally equal to the precipitated material growth rate in the direction of the movement of the coinciding foci in relation to the substrate.

4. The apparatus of claim 3, wherein the gaseous compound produces the structure material through thermal decompounding which absorbs laser beam radiation relatively poorly.

5. The apparatus of claim 3, further comprising:

a chamber for reception of the substrate;

means for generating within the chamber an atmosphere containing the gaseous compound;

means for supporting the substrate in the chamber;

means for moving the substrate in relation to the focal point of the first laser beam; and means for moving the focal point of the first laser beam away from the substrate surface.

6. The apparatus of claim 5, comprising a single laser and a beam splitter for generating the first and second laser beams.

7. The apparatus of claim 5, comprising a first laser for generating the first laser beam and a second laser for generating the second laser beam.

8. The apparatus of claim 7, wherein the first and second lasers have different emission wavelengths.

* * * * *